(12) United States Patent
Kon

(10) Patent No.: US 8,313,892 B2
(45) Date of Patent: Nov. 20, 2012

(54) MULTI-LAYER BODY, METHOD FOR FORMING RESIST PATTERN, METHOD FOR MANUFACTURING DEVICE HAVING PATTERN BY FINE PROCESSING AND ELECTRONIC DEVICE

(75) Inventor: Junichi Kon, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 344 days.

(21) Appl. No.: 11/050,830

(22) Filed: Feb. 7, 2005

(65) Prior Publication Data

US 2005/0277055 A1   Dec. 15, 2005

(30) Foreign Application Priority Data

Jun. 9, 2004   (JP) ................................. 2004-171202
Nov. 22, 2004  (JP) ................................. 2004-337249

(51) Int. Cl.
*G03C 1/85* (2006.01)
*G03C 1/00* (2006.01)
*G03F 7/00* (2006.01)

(52) U.S. Cl. .................... 430/527; 430/270.1; 430/273.1

(58) Field of Classification Search ............... 430/271.1, 430/273.1, 270.1, 311, 527
See application file for complete search history.

(56) References Cited

U.S. PATENT DOCUMENTS

| | | | |
|---|---|---|---|
| 4,491,628 A | 1/1985 | Ito et al. | |
| 5,019,485 A * | 5/1991 | Nakamura et al. | 430/296 |
| 5,093,439 A * | 3/1992 | Epstein et al. | 525/540 |
| 5,198,326 A * | 3/1993 | Hashimoto et al. | 430/296 |
| 5,256,454 A | 10/1993 | Murai et al. | |
| 5,589,270 A * | 12/1996 | Murai et al. | 428/411.1 |
| 5,776,659 A * | 7/1998 | Watanabe et al. | 430/296 |
| 5,804,354 A * | 9/1998 | Watanabe et al. | 430/325 |
| 6,319,643 B1 | 11/2001 | Singh et al. | |
| 6,929,891 B2 * | 8/2005 | Rushkin et al. | 430/18 |
| 7,163,751 B2 * | 1/2007 | Wayton et al. | 428/480 |
| 2001/0044077 A1 | 11/2001 | Tan | |
| 2003/0152845 A1 * | 8/2003 | Kumada et al. | 430/5 |

FOREIGN PATENT DOCUMENTS

| | | |
|---|---|---|
| EP | 0 364 368 A2 | 4/1990 |
| EP | 0 399 299 A2 | 11/1990 |
| EP | 1 315 044 A1 | 5/2003 |
| JP | 2-103547 | 4/1990 |
| JP | 4-32848 | 2/1992 |

(Continued)

OTHER PUBLICATIONS

Database WPI, Section Ch, Week 200369 Derwent Publications Ltd., London, GB; AN 2003-724645 XP002338621 & JP 2003 057802 A (Mitsubishi Electric Corp) Feb. 28, 2003.

(Continued)

*Primary Examiner* — Mark F Huff
*Assistant Examiner* — Connie P Johnson
(74) *Attorney, Agent, or Firm* — Westerman, Hattori, Daniels & Adrian, LLP

(57) ABSTRACT

Technologies to form fine resist patterns consistently by solving the problem of poor patterning influenced by a resist-protecting film, are provided. A layer made of a resist (resist layer) is formed on a substrate, a resist-protecting film comprising an antistatic resin and a photo-acid generating agent is formed on the resist layer, and active-energy rays are selectively irradiated over the resist-protecting film, so that a resist pattern is formed by developing the resist.

8 Claims, 13 Drawing Sheets

FOREIGN PATENT DOCUMENTS

| | | |
|---|---|---|
| JP | 4-204848 | 7/1992 |
| JP | 06-110214 | 4/1994 |
| JP | 7-41756 | 2/1995 |
| JP | 7-140668 | 6/1995 |
| JP | 7-168367 | 7/1995 |
| JP | 7-295228 | 11/1995 |
| JP | 8-109351 | 4/1996 |
| JP | 11-153871 | 6/1999 |
| JP | 2001-181221 | 7/2001 |
| JP | 3228832 | 9/2001 |
| JP | 2003-057802 A | 2/2003 |

OTHER PUBLICATIONS

Search Report dated Jul. 3, 2007 issued in corresponding European Application No. 05003044.4 1226.

Japanese Office Action dated Jan. 26, 2010, issued in corresponding Japanese Patent Application No. 2004-337249.

European Office Action dated Apr. 13, 2011, issued in corresponding European Patent Application No. 05003044.4.

\* cited by examiner

72

111

MULTI-LAYER BODY, METHOD FOR FORMING RESIST PATTERN, METHOD FOR MANUFACTURING DEVICE HAVING PATTERN BY FINE PROCESSING AND ELECTRONIC DEVICE

CROSS-REFERENCE TO RELATED APPLICATIONS

This application is based upon and claims the benefit of priority from the prior Japanese Patent Application No. 2004-171202, filed on Jun. 9, 2004 and No. 2004-337249, filed on Nov. 22, 2004, the entire contents of which are incorporated herein by reference.

BACKGROUND OF THE INVENTION

1. Field of the Invention

The present invention relates to a composition for protecting a resist that provides good results when applied to fine processing in the manufacturing of a semiconductor device, a mask, a magnetic head, etc., as well as a multi-layer body, a method for forming a resist pattern, a method for manufacturing a device having a pattern by fine processing and an electronic device that use the composition.

2. Description of the Related Art

In response to the elevation of the level of integration of LSI, the pattern resolution has entered a very fine region of 0.1 μm or less. Accordingly, it is indispensable to establish a fine processing technology that can cope with the resolution level. In the field of lithography, forming a finer pattern using an exposure light source with a shorter wavelength, or even using electron beams, X-rays, or the like, is being studied to respond to the requirement. In particular, the electron-beam lithography and X-ray lithography are considered to be second-generation light exposure technologies, and it is an urgent issue to develop a resist technology and pattern formation technology that have a high sensitivity and a high resolution to correspond to these technologies.

As a resist that can correspond to the electron-beam lithography and X-ray lithography, a chemically amplified resist comprising a photo-acid generating agent {see, for example, U.S. Pat. No. 4,491,628 (claims), Proc. Microcircuit Eng. (J. M. J. Frechet et al., p. 260, 1982), Digest of Technical Papers of 1982, Symposium on VLSI Technology (H. Ito et al., p. 86, 1983), and Polymers in Electronics, (H. Ito et al., ACS Symposium Series 242, ACS, p. 11, 1984)} is considered to be promising. With this chemically amplified resist, as easily understood from the above-described references, an acid is generated from a photo-acid generating agent by the irradiation of UV rays, electron beams, X-rays, focused ion beams, etc., and exposed parts are turned into an alkali-soluble (positive type) material or alkali-insoluble (negative-type) material by means of baking after the light exposure, utilizing the catalytic reaction. Owing to this, an apparent quantum yield can be improved, and a higher sensitivity is realized. A chemically amplified resist comprises a base resin, a photo-acid generating agent, various additives, and a solvent, in general. A cross-linking agent is further added, in the case of a negative-type resist.

It is to be noted that, in the light exposure with electron beams, a charge-up phenomenon, that is accumulation of electric charges, occurs during the light exposure owing to the fact that the resist is an insulative material, which causes a problem of deviation of locations of the resist pattern (poor patterning). For the purpose of avoiding this problem, a film from an electroconductive resin or antistatic resin, that is a resist-protecting film, is formed on the resist to prevent accumulation of electrons {see Japanese Unexamined Patent Application Publication No. 4-32848 (claims) and No. 8-109351 (claims)}.

Resins for forming this resist-protecting film generally indicate basicity due to reasons for the manufacturing or the like, and accordingly, there is a problem that when such a resist-protecting film is formed on a chemically amplified resist layer, it neutralizes the acid generated from the resist in the vicinity of the interface, resulting in poor resolution in the case of a positive-type resist, and thinning of the film in the case of a negative-type resist. This will be explained using FIGS. 1, 2, 3 and 4 schematically illustrating side cross-sectional views of multi-layer bodies having a chemically amplified resist layer and resist-protecting film on a substrate. FIGS. 1 and 2 are examples of a positive type resist, and FIGS. 3 and 4 are examples of a negative-type resist.

FIG. 1 illustrates a multilayer body 11 as it is irradiated with electron beams, where hydrogen ions (H+) of an acid are generated in a positive-type resist layer 2 on a substrate 1. In this case, bases (indicated as X$^-$) in a resist-protecting film 3 acts to neutralize the hydrogen ions. Therefore, the amount of the hydrogen ions is particularly insufficient in the vicinity of the interface 4 with the resist-protecting film, and thus, the part does not indicate sufficient solubility at the development, with the result that in the multilayer body 12 after the development, the edges 6 of the insoluble parts 5 result in a T-type poor resolution (T-top) as illustrated in a letter T in FIG. 2. Numeral 7 indicates a space that is formed by dissolution/removal of the resist.

In contrast, FIG. 3 illustrates a multilayer body 31 as it is irradiated with electron beams, where hydrogen ions (H+) of an acid are generated in a negative-type resist layer 2. In this case, bases (indicated as X$^-$) in a resist-protecting film 3 acts to neutralize the hydrogen ions. Therefore, the amount of the hydrogen ions is particularly insufficient in the vicinity of the interface 8 with the resist-protecting film, and thus, the part does not indicate sufficient insolubility at the development, with the result that in the multilayer body 32 after the development, thinned film parts 9 (round top) occur due to rounding of the edges and thinning of the resist layer as shown in FIG. 4.

In order to solve this problem, a measure is taken to add an acidic compound to the resist-protecting film. However, an acidic compound works the other way and accelerates the reaction of the resist in the vicinity of the interface between the resist-protecting film and resist layer, causing poor resolution in the case of a negative-type resist and film thinning in the case of a positive-type resist. This will be explained using FIGS. 5, 6, 7 and 8 schematically illustrating side cross-sectional views of multi-layer bodies having a chemically amplified resist layer and resist-protecting film on a substrate. FIGS. 5 and 6 are examples of a positive type resist, and FIGS. 7 and 8 are examples of a negative-type resist.

FIG. 5 illustrates a multilayer body 51 as it is irradiated with electron beams, where hydrogen ions (H+) of an acid are generated in a positive-type resist layer 2. In this case, hydrogen ions (indicated as H$^+$) of the acidic compound in a resist-protecting film 3 act to add to the action of the hydrogen ions in the resist layer at sections that have been irradiated with the electron beams, and also cause the reaction in the resist layer even at those sections that have not been irradiated with the electron beams, with the result that such sections show excessive solubility at the development, and accordingly, the multilayer body 52 after the development has a thinned resist layer with thinned parts 9 having round edges, as shown in FIG. 6.

In contrast, FIG. 7 illustrates a multilayer body 71 as it is irradiated with electron beams, where hydrogen ions (H+) of an acid are generated in a negative-type resist layer 2. In this case, acidic ions (indicated as H⁺) of the acidic compound in a resist-protecting film 3 cause the reaction in the resist layer 5 even at those sections that have not been irradiated with the electron beams, with the result that such sections become insoluble at the development, and accordingly, the edges 6 of the insoluble parts 5 result in a T-type poor resolution in the multilayer body 72 after the development, as shown in FIG. 8.

With such problems at the background, a method for forming a pattern using a resist-protecting film (also simply referred as "protecting film" in this specification) that can prevent accumulation of electric charges without affecting normal formation of a resist pattern, is being desired.

It is an object of the present invention to solve such poor patterning problems and to provide a technology by which fine patterns are consistently obtained. Other objects and advantages of the present invention will be clarified through the following explanation.

SUMMARY OF THE INVENTION

According to one aspect of the present invention, a composition for protecting a resist comprising an antistatic resin and a photo-acid generating agent, is provided.

According to another aspect of the present invention, a multi-layer body having, on a substrate, a resist layer and a resist-protecting film comprising an antistatic resin and a photo-acid generating agent, is provided.

According to still another aspect of the present invention, a method for forming a resist pattern comprising: forming a layer made of a resist (resist layer) on a substrate; forming a resist-protecting film comprising an antistatic resin and a photo-acid generating agent on the resist layer; selectively irradiating active-energy rays over the resist-protecting film; and developing the resist, is provided.

According to still another aspect of the present invention, a method for manufacturing a device having a pattern by fine processing comprising: forming a layer made of a resist (resist layer) on a substrate; forming a resist-protecting film comprising an antistatic resin and a photo-acid generating agent on the resist layer; selectively irradiating active-energy rays over the resist-protecting film; and developing the resist to form a resist pattern, is provided.

According to still another aspect of the present invention, a device such as an electronic device having a pattern by fine processing that is obtained by the above-described manufacturing method, is provided.

By the present invention, the problem of poor patterning influenced by a resist-protecting film is solved, and consistent formation of fine patterns is realized.

Preferable are that the resist is a chemically amplified positive-type or negative-type resist; that the antistatic resin comprises a water-soluble polymer; that the photo-acid generating agent comprises at least one compound selected from the group consisting of a diazonium salt, an iodonium salt, a sulfonium salt, a sulfonic acid ester, an oxathiazole derivative, a triazine derivative, a disulfone derivative, an imide compound, an oxime sulfonate, a diazonaphthoquinone and a benzoin tosylate; particularly that the photo-acid generating agent comprises at least one compound selected from the group consisting of diphenyliodonium trifluoromethanesulfonate, diphenyliodonium perfluorobutanesulfonate, diphenyliodonium hexafluorophosphate, triphenylsulfonium hexafluoroantimonate, triphenylsulfonium hexafluorophosphate, triphenylsulfonium methanesulfonate, triphenylsulfonium trifluoromethanesulfonate, triphenylsulfonium perfluorobutanesulfonate, 1-phenyl-1-(4-methylphenyl) sulfonyloxy-1-benzoylmethane, 1,2,3-trisulfonyloxymethylbenzene, 1,3-dinitro-2-(4-phenylsulfonyloxymethyl)benzene and 1-phenyl-1-(4-methylphenylsulfonyloxymethyl)-1-hydroxy-1-benzoylmethane; that the antistatic resin comprises at least one of the materials having structure units represented by the following general formulas,

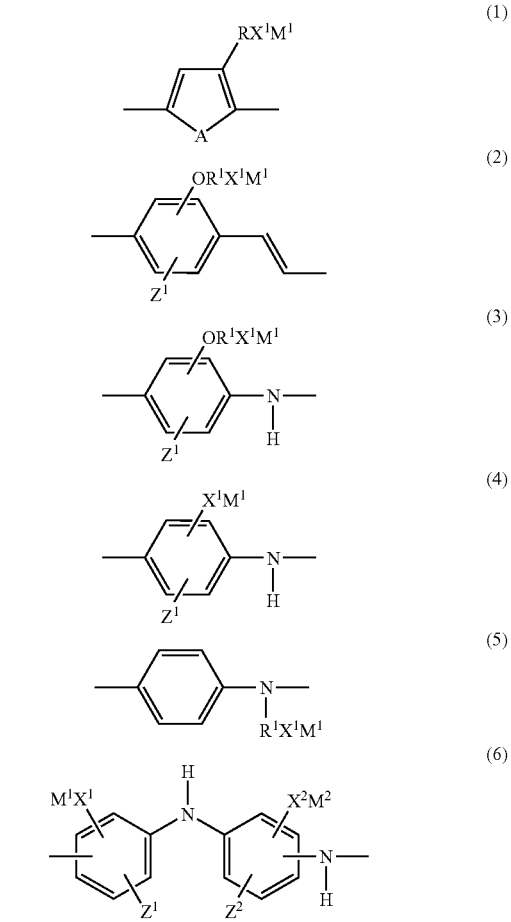

{in the formulas and the explanation thereof, A is NH or O; R is $R^1$ or $OR^1$; $X^1$ and $X^2$ are each $SO_3$ or COO; $Z^1$ and $Z^2$ are each $OR^1X^3$—H or an electron donating group (where $X^3$ is $SO_3$, COO or direct bonding); $R^1$ is a straight-chain or branched, divalent hydrocarbon group that may contain an ether bond; $M^1$ and $M^2$ are each a hydrogen ion, an ammonium ion, an alkyl ammonium ion having 1 to 8 carbons, an aromatic ammonium ion or a quaternary ion of an aromatic heterocyclic ring; and each symbol can be determined independently from each other in the formulas as well as in the explanation of the formulas}; that the photo-acid generating agent is water-soluble; that the sensitivity of the photo-acid generating agent is the same as or higher than that of a photo-acid generating agent in the resist layer; that the content of the photo-acid generating agent in the resist-protecting film is the same as or higher than that of a photo-acid generating agent in the resist layer; that the active-energy rays are charged particle beams; that the thickness of the resist-protecting film is in the range of 0.01-0.2 μm; and that the device having a pattern by fine processing is a semiconductor device, a mask or a magnetic head.

By this invention, poor patterning caused by the resist-protecting film is solved, and formation of a fine pattern is realized consistently. Furthermore, while in the conventional pattern formation, the acidity of the resist-protecting film is adjusted for each resist, one resist-protecting film of the present invention can be applicable to a plurality of resists, with the result that the versatility is enhanced.

DESCRIPTION OF THE PREFERRED EMBODIMENTS

Figure 1:
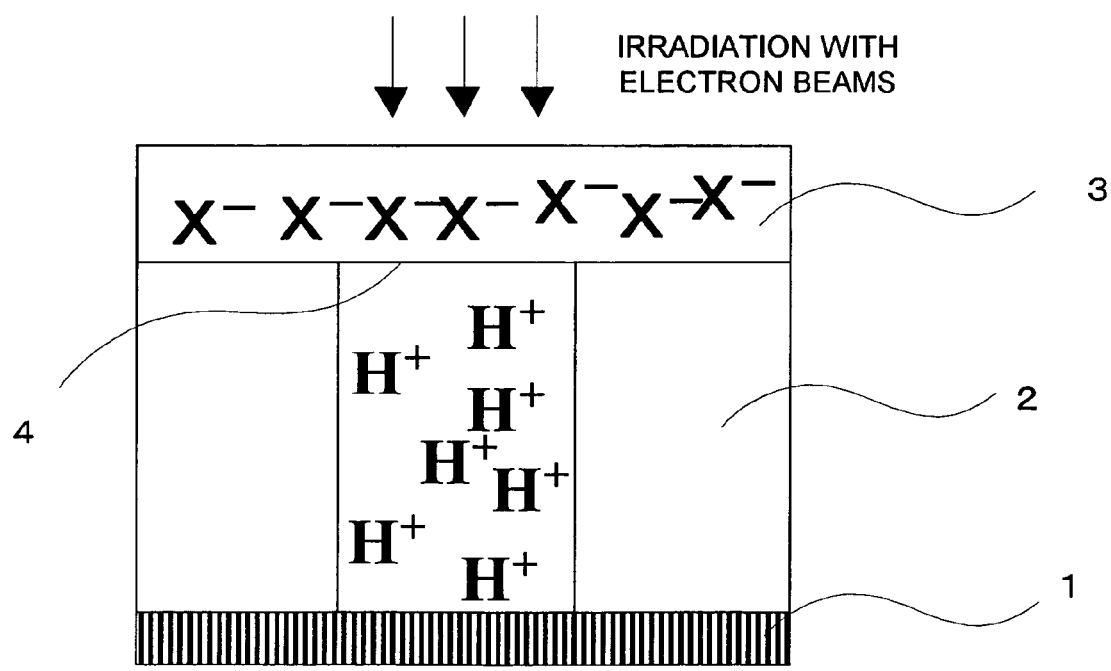
FIG. 1 is a schematic cross-sectional view of a multilayer body as it is irradiated with electron beams, where hydrogen ions of an acid are generated in a resist layer.

Embodiments according to the present invention will be described with reference to the following figures, tables, formulas, examples, etc. It is to be understood that these figures, tables, formulas, examples, etc., plus the explanation below are for the purpose of illustrating the present invention, and do not limit the scope of the present invention. It goes without saying that other embodiments should also be included in the category of the present invention as far as they conform to the gist of the present invention. In the figures, the same sign indicates the same element.

A protecting film according to the present invention can be realized by using a composition for protecting a resist comprising an antistatic resin and a photo-acid generating agent. It is to be noted that the composition for protecting a resist may have any shape as long as it comprises an antistatic resin and a photo-acid generating agent. It can be in a film shape. For example, the protecting film according to the present invention itself can be regarded as a composition for protecting a resist according to the present invention. It may also comprise other components including a solvent.

In addition, the photo-acid generating agent according to the present invention may be composed of any substance that can generate hydrogen ions at the light exposure. It may also be composed of a plurality of substances.

The "resist" according to the present invention may include any resist that is used for electronic devices or the like. Those for manufacturing semiconductor devices, masks or magnetic heads that need a high resolution of patterning are particularly preferable.

For forming a resist pattern according to the present invention, included are steps comprising: forming a multilayer body comprising a resist layer and a protecting film containing an antistatic resin and a photo-acid generating agent on a substrate, by forming a resist layer by applying a resist on the substrate or by a different treatment, and forming a protecting film containing an antistatic resin and a photo-acid generating agent on the resist layer; selectively irradiating over the protecting film with active-energy rays; optionally baking the substrate with the above layers; and subjecting it to development. It goes without saying that other steps may also be included. For the steps, the protecting film containing an antistatic resin and a photo-acid generating agent may be manufactured by using the composition for protecting a resist according to the present invention. It is to be noted that the multilayer body may comprise other layers between the substrate and resist layer or under the substrate.

When a resist pattern according to the present invention is formed, any known method can be used for forming the resist layer and the protecting film. Spin coating is practical and is desirable. "Selective" irradiation with active-energy rays can be realized by irradiating active-energy rays with a mask, for example. Known methods can be employed for the baking and the development. The thickness of the protecting film, is preferably in a range of 0.01 to 0.2 µm.

It is possible to prevent deactivation of an acid generated from the photo-acid generating agent in the resist layer with a base in the protecting film and to avoid poor patterning, by neutralizing the base with an acid in the protecting film during the irradiation of the active-energy rays, at sections where the active-energy rays are irradiated, the acid being generated only at sections where the active-energy rays are irradiated in the protecting film to which the photo-acid generating agent has been added previously.

Figure 9:
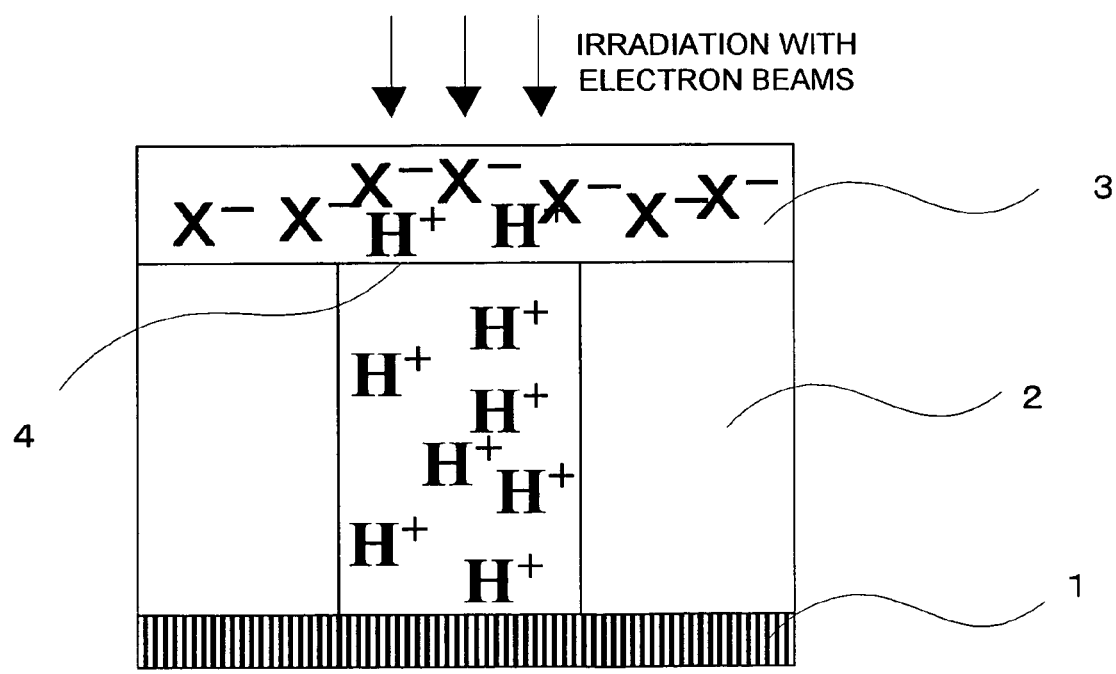
FIG. 9 is another schematic cross-sectional view of a multilayer body as it is irradiated with electron beams, where hydrogen ions of an acid are generated in a resist layer.
Figure 10:
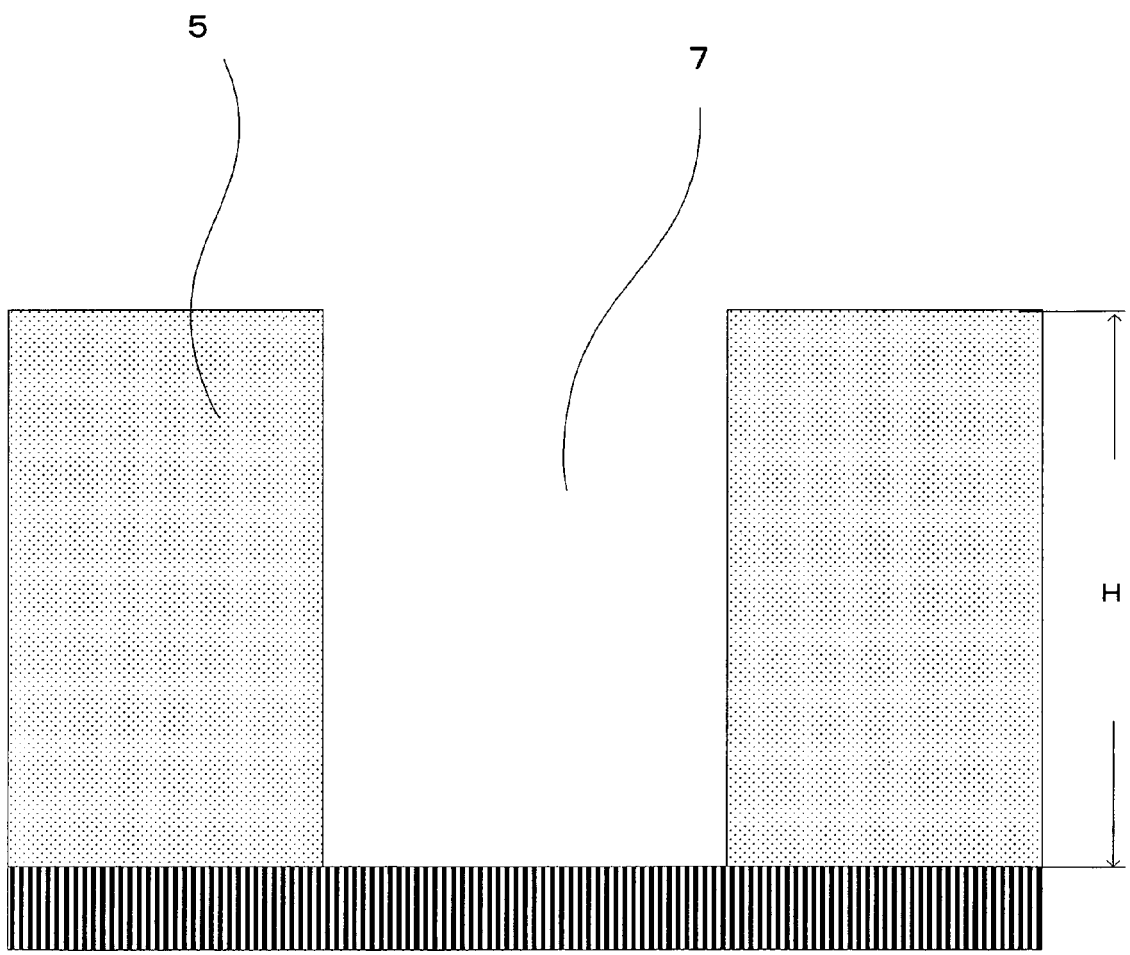
FIG. 10 is another schematic cross-sectional view of a multilayer body after development.
Figure 11:
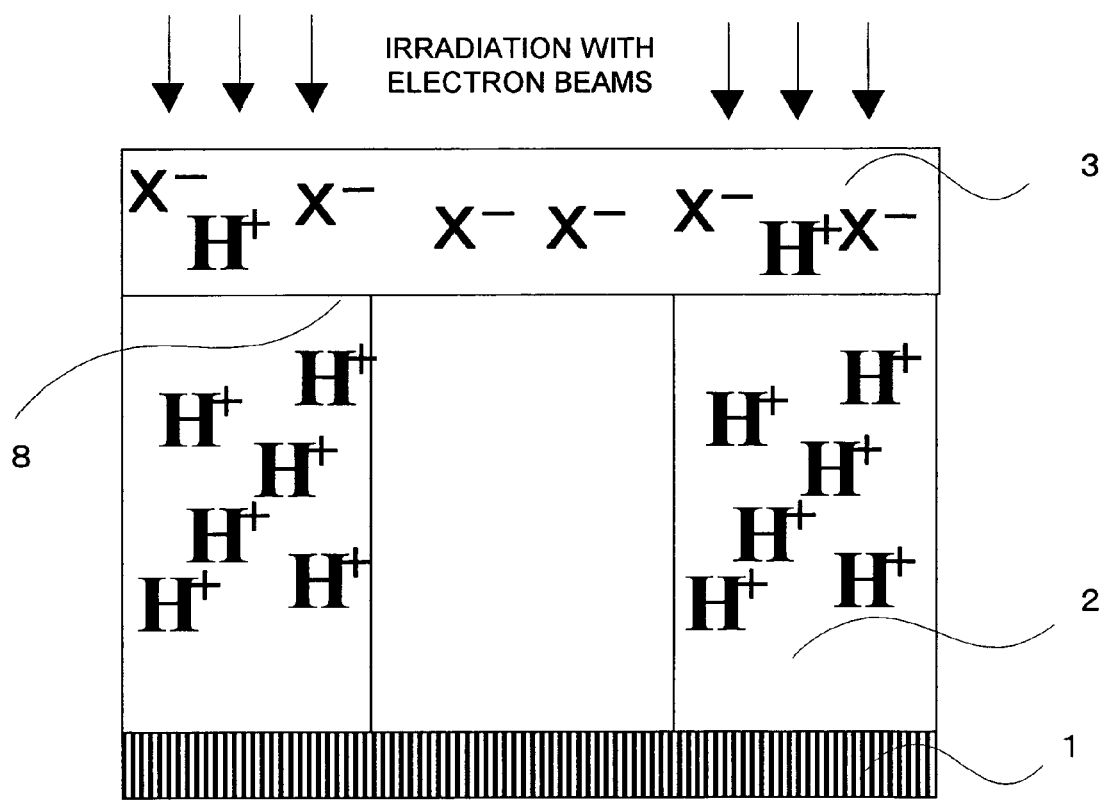
FIG. 11 is another schematic cross-sectional view of a multilayer body as it is irradiated with electron beams, where hydrogen ions of an acid are generated in a resist layer.
Figure 12:
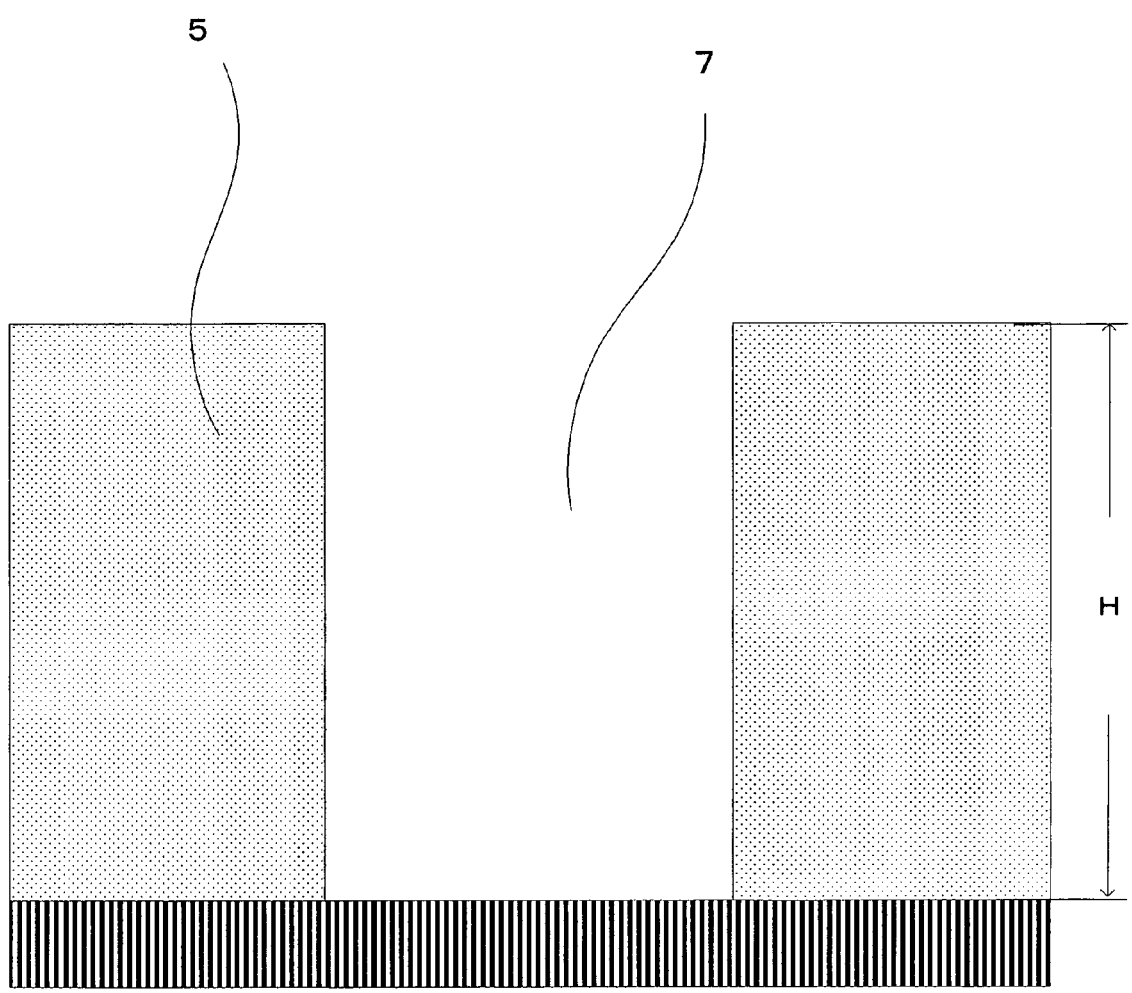
FIG. 12 is another schematic cross-sectional view of a multilayer body after development.

How this is performed is illustrated by schematic cross-sectional views of multi-layer bodies comprising a chemically amplified resist layer and a protecting film on a substrate. FIGS. 9, 10, 11 and 12 are used for the explanation. FIGS. 9 and 10 illustrate a positive-type resist, and FIGS. 11 and 12 illustrate a negative-type resist.

FIG. 9 illustrates a multilayer body 91 as it is irradiated with active-energy rays, where hydrogen ions ($H^+$) of acids are generated in a positive-type resist layer 2 and a protecting film. In this case, the base (indicated as $X^-$) present in the protecting film 3 is neutralized with the acid (indicated as $H^+$) generated in the protecting film, and accordingly, the amount of hydrogen ions in the resist layer is prevented from being insufficient even in the vicinity of the interface 4 with the protecting film, with the result that it is possible to obtain a preferably square-built pattern at the development, as shown in the multilayer body 92 in FIG. 10.

Furthermore, FIG. 11 illustrates a multilayer body 111 as it is irradiated with active-energy rays, where hydrogen ions ($H^+$) of acids are generated in a negative-type resist layer 2 and a protecting film. In this case, the base (indicated as $X^-$) present in the protecting film 3 is neutralized with the acid (indicated as $H^+$) generated in the protecting film, and accordingly, the amount of hydrogen ions in the vicinity of the interface 8 with the protecting film is prevented from being insufficient, and the section shows sufficient insolubility at development, with the result that it is possible to obtain a preferably square-built pattern at the development, as shown in the multilayer body 112 in FIG. 12.

Although the explanation heretofore was made using $H^+$ as an acid and $X^-$ as a base, it is to be noted that the present invention is not limited to this explanation, and Brønsted acids and bases as well as Lewis acids and bases may be used as the acid and base, as long as the objects of the present invention are met. The acid in the above-described photo-acid generating agent may be replaced with an electron pair acceptor, for example.

There is no particular limitation to a resist for which the effect of the present invention is expected, and known materials may be used. Two-component type resists composed of a base resin and a photosensitive material can be favorably used, for example. In particular, an extremely high effect will be manifested with chemically amplified resists that are highly sensitive and susceptible to the influence of the external environments. The chemically amplified resist may be positive-type or negative-type.

The "antistatic resins" according to the present invention include resins that do not reach to the range of electroconductive materials but can prevent or eliminate electrostatic charging on the resist layer as well as electroconductive resins. More specifically, resins having a sheet resistance of $1 \times 10^8$ $\Omega/cm^2$ or less are the examples.

There is no particular limitation to the antistatic resin. It can be arbitrarily selected according to the purpose from the group consisting of polyaniline, poly-paraphenylene, polythiophene, polypyrrole, poly-(p-phenylene oxide), polyfuran, polyphenylene, polyazine, polyselenophene, poly(phenylene sulfide), polyacetylene etc. and any one of them with an additive. Water-soluble polymers are preferable, since they can easily form a film on the resist layer, and can be easily peeled off using water or the like at a step before development. More specifically, an antistatic resin preferably comprises at least one selected from the group consisting of materials comprising the structure units represented by the following general formulas. Among them, those comprising the structure units of formulas (2) to (6) are more preferable, and those comprising the structure unit of formula (6) can be particularly desirably used for the present invention. Hereupon, the materials may be monomers or oligomers, but polymers are preferable. Such polymers may contain other structure units. The degree of polymerization can be appropriately decided according to the required conditions such as the viscosity for actual use.

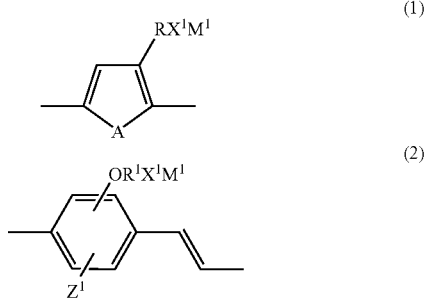

(1)

(2)

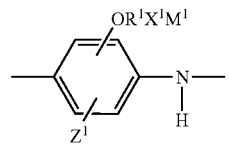

(3)

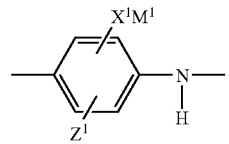

(4)

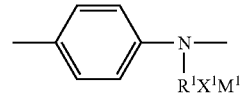

(5)

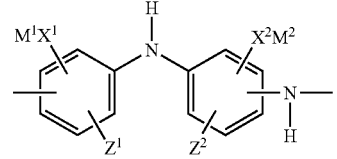

(6)

{in the formulas and the explanation thereof, A is NH or O; R is $R^1$ or $OR^1$; $X^1$ and $X^2$ are each $SO_3$ or COO; $Z^1$ and $Z^2$ are each $OR^1X^3$—H or an electron donating group (where $X^3$ is $SO_3$, COO or direct bonding); $R^1$ is a straight-chain or branched, divalent hydrocarbon group that may contain an ether bond; $M^1$ and $M^2$ are each a hydrogen ion, an ammonium ion, an alkyl ammonium ion having 1 to 8 carbons, an aromatic ammonium ion or a quaternary ion of an aromatic heterocyclic ring; and each symbol can be determined independently from each other in the formulas as well as in the explanation of the formulas}.

As such an antistatic resin, specifically enumerated are 3-amino-4-methoxybenzenesulfonic acid polymers and polymers having a monomer unit such as furan-3-(2-ethanesulfonic acid), furan-3-(3-propanesulfonic acid), furan-3-(4-butanesulfonic acid), furan-3-(5-pentanesulfonic acid), furan-3-(6-hexanesulfonic acid), pyrrole-3-(2-ethanesulfonic acid), pyrrole-3-(3-propanesulfonic acid), pyrrole-3-(4-butanesulfonic acid), pyrrole-3-(5-pentanesulfonic acid), pyrrole-3-(6-hexanesulfonic acid), 2-methoxy-5-(propyloxy-3-sulfonic acid)-1,4-phenylenevinylene, 2-ethoxy-5-(propyloxy-3-sulfonic acid)-1,4-phenylenevinylene, 2-propyloxy-5-(propyloxy-3-sulfonic acid)-1,4-phenylenevinylene, 2-butyloxy-5-(propyloxy-3-sulfonic acid)-1,4-phenylenevinylene, 2,5-bis(propyloxy-3-sulfonic acid)-1,4-phenylenevinylene, 2,5-bis(ethyloxy-2-sulfonic acid)-1,4-phenylenevinylene, 2,5-bis(butyloxy-4-sulfonic acid)-1,4-phenylenevinylene, 5-(propyloxy-3-sulfonic acid)-1,4-phenylenevinylene, 5-(ethyloxy-2-sulfonic acid)-1,4-phenylenevinylene, 5-(butyloxy-4-sulfonic acid)-1,4-phenylenevinylene, 5-(pentyloxy-4-sulfonic acid)-1,4-phenylenevinylene, aniline-3-(2-ethanesulfonic acid), aniline-3-(3-propanesulfonic acid), aniline-3-(4-butanesulfonic acid), aniline-3-(5-pentanesulfonic acid), aniline-3-(6-hexanesulfonic acid), aniline-3-(7-heptanesulfonic acid), aniline-3-(2-methyl-3-propanesulfonic acid), aniline-3-(2-methyl-4-butanesulfonic acid), aniline-3-sulfonic acid, aniline-N-(2-ethanesulfonic acid), aniline-N-(3-propanesulfonic acid), aniline-N-(4-butanesulfonic acid), aniline-N-(5-pentanesulfonic acid), aniline-N-(6-hexanesulfonic acid), aniline-N-(7-heptanesulfonic acid), aniline-N-(2-methyl-3- propanesulfonic acid), aniline-N-(2-methyl-4-butanesulfonic acid), 2-aminoanisole-3-sulfonic acid, 2-aminoanisole-4-sulfonic acid, 2-aminoanisole-5-sulfonic acid, 2-aminoanisole-6-sulfonic acid, 3-aminoanisole-2-sulfonic acid, 3-aminoanisole-4-sulfonic acid, 3-aminoanisole-5-sulfonic acid, 3-aminoanisole-6-sulfonic acid, 4-aminoanisole-2-sulfonic acid, 4-aminoanisole-3-sulfonic acid, 2-amino-4-ethoxybenzenesulfonic acid, 3-amino-4-ethoxybenzenesulfonic acid, 2-amino-4-butoxybenzenesulfonic acid, 3-amino-5-butoxybenzenesulfonic acid, 2-amino-4-propoxybenzenesulfonic acid, 3-amino-6-propoxybenzenesulfonic acid, 2-amino-4-isobutoxybenzenesulfonic acid, 3-amino-4-isobutoxybenzenesulfonic acid, 3-amino-4-t-butoxybenzenesulfonic acid, 2-amino-4-t-butoxybenzenesulfonic acid, 2-amino-4-heptoxybenzenesulfonic acid, 3-amino-5-heptoxybenzenesulfonic acid, 2-amino-4-hexoxybenzenesulfonic acid, 3-amino-5-octoxybenzenesulfonic acid, 2-amino-4-nanoxybenzenesulfonic acid, 3-amino-5-decanoxybenzenesulfonic acid, 2-amino-4-undecanoxybenzenesulfonic acid, and 3-amino-5-dodecanoxybenzenesulfonic acid.

Any photo-acid generating agent may be arbitrarily selected for adding to the protecting film as long as it is suitable for the purpose. Examples are a diazonium salt, an iodonium salt (such as diphenyliodonium trifluoromethanesulfonate, diphenyliodonium perfluorobutanesulfonate and diphenyliodonium hexafluorophosphate), a sulfonium salt (such as triphenylsulfonium hexafluoroantimonate, triphenylsulfonium hexafluorophosphate, triphenylsulfonium methanesulfonate, and triphenylsulfonium trifluoromethanesulfonate triphenylsulfonium hexafluoroantimonate), a sulfonic acid ester such as 1-phenyl-1-(4-methylphenyl) sulfonyloxy-1-benzoylmethane, 1,2,3-trisulfonyloxymethylbenzene, 1,3-dinitro-2-(4-phenylsulfonyloxymethyl)benzene, and 1-phenyl-1-(4-methylphenylsulfonyloxymethyl)-1-hydroxy-1-benzoylmethane, as well as an oxathiazole derivative, a triazine derivative, a disulfone derivative (such as diphenyl disulfone), an imide compound, an oxime sulfonate, a diazonaphthoquinone, and a benzoin tosylate. These agents may be used singly or plurally. The photo-acid generating agent for the protecting film may be the same as or different from the photo-acid generating agent for the resist.

It is particularly preferable that the photo-acid generating agent comprises at least one compound selected from the group consisting of diphenyliodonium trifluoromethanesulfonate, diphenyliodonium perfluorobutanesulfonate, diphenyliodonium hexafluorophosphate, triphenylsulfonium hexafluoroantimonate, triphenylsulfonium hexafluorophosphate, triphenylsulfonium methanesulfonate, triphenylsulfonium trifluoromethanesulfonate, triphenylsulfonium perfluorobutanesulfonate, 1-phenyl-1-(4-methylphenyl) sulfonyloxy-1-benzoylmethane, 1,2,3-trisulfonyloxymethylbenzene, 1,3-dinitro-2-(4-phenylsulfonyloxymethyl)benzene, and 1-phenyl-1-(4-methylphenylsulfonyloxymethyl)-1-hydroxy-1-benzoylmethane.

It is to be noted that when the antistatic resin used for the protecting film is water-soluble, it is preferable that the photo-acid generating agent to be added to the protecting film is also water-soluble, since it can be easily formed into a film on the resist layer, and can be easily peeled off, using water or the like at a development pretreatment. Among the above-described photo-acid generating agents, compounds having ionic bonding are particularly preferable.

In addition, it is preferable that the photo-acid generating agent added to the protecting film has the same sensitivity as or higher sensitivity than the photo-acid generating agent added to the resist film, so as to effectively neutralize the base in the protecting films. The sensitivity in this case can be evaluated, for example, as follows: when the amounts of light exposure to obtain a given amount of patterning (such as width of a pattern) are compared in the unit of coulomb/cm$^2$, a smaller value is regarded as higher in sensitivity. Comparison of quantum yields may also be used for the evaluation. In any case, comparison of the sensitivities is made under the same condition. Specifically, it is preferable, for both photo-acid generating agents, to evaluate their effects when they are added to a resist.

In addition, it is preferable that the content of the photo-acid generating agent in the protecting film is the same as or higher than that of the photo-acid generating agent in the above-described resist layer. It is to be noted that the "content of photo-acid generating agent" according to the present invention is a molar concentration per a unit volume.

Photo-acid generating agents that satisfy the above-described requirements are, for example, a triphenylsulfonium salt (TPS$^+$) and a diphenyliodonium salt (DPI$^+$). Since the quantum yield of light with DPI$^+$ is higher than that with TPS$^+$ (that is, the sensitivity of DPI$^+$ is higher than that of TPS$^+$), the effect of the present invention will become higher by adding DPI$^+$ to the protecting film, when the resist layer contains TPS$^+$.

Furthermore, when the same photo-acid generating agent is used for the resist layer and the protecting film, the effect of the present invention can be further exhibited by making the content of the photo-acid generating agent added to the protecting film higher than that added to the resist layer.

In addition, a surfactant may be added to the protecting film so as to improve the affinity between the protecting film and the resist layer, and to further increase the effect of the addition of the photo-acid generating agent.

There is no particular limitation to the surfactant, and an appropriate surfactant may be selected according to the purposes. Nonionic surfactants, cationic surfactants, anionic surfactants, amphoteric surfactants, etc. are examples. A singe surfactant may be used. Two or more surfactants may also be used. Among these, nonionic surfactants are preferable since they do not contain metal ions.

As the nonionic surfactant, preferable are those selected from the group consisting of alkoxylated-type surfactants, fatty acid ester-type surfactants, amide-type surfactants, alcohol-type surfactants and ethylene diamine-type surfactants. It is to be noted that as the specific examples, polyoxyethylene polyoxypropylene condensation compounds, polyoxyalkylene alkyl ether compounds, polyoxyethylene alkyl ether compounds, polyoxyethylene derivative compounds, sorbitan fatty acid ester compounds, glycerol fatty acid ester compounds, primary alcohol ethoxylate compounds, phenol ethoxylate compounds, nonylphenol ethoxylate-type compounds, octylphenol ethoxylate-type compounds, lauryl alcohol ethoxylate-type compounds, oleyl alcohol ethoxylate-type compounds, fatty acid ester-type compounds, amide-type compounds, natural alcohol-type compounds, ethylene diamine-type compounds, secondary alcohol ethoxylate-type compounds, etc. are enumerated.

There is no particular limitation to the cationic surfactant, and an appropriate cationic surfactant may be selected according to the purposes. Alkyl cationic-type surfactants, amide-type quaternary cationic surfactants, ester-type quaternary cationic surfactants, etc. are examples.

There is no particular limitation to the amphoteric surfactants, and an appropriate amphoteric surfactant may be selected according to the purposes. Amine oxide-type surfactants, betaine-type surfactant, etc. are examples.

Although the preferable content of the surfactant in the protecting film varies according to the type, content, etc. of the antistatic resin, and accordingly cannot be decided categorically, it may be decided appropriately according to the purposes.

Furthermore, when the resist to which the protecting film is applied is of a negative-type, it is possible to further increase the effect of the shape improvement by the present invention, by adding a cross-linking agent to the protecting film, in order to facilitate the cross-linking reaction of the resist.

There is no particular limitation to the cross-linking agent, and an appropriate cross-linking agent may be selected according to the purposes. For example, water-soluble agents in which cross-linking occurs by the action of heat or an acid, are preferable. Among them, amino-type cross-linking agents are more preferable.

As an amino-type cross-linking agent, melamine derivatives, urea derivatives, uryl derivatives, etc. are desirable examples. A single agent may be used. Two or more agents may also be used.

As a urea derivative, urea, alkoxy methylene urea, N-alkoxymethylene urea, ethylene urea, ethylene urea carboxylic acid, derivatives thereof, etc. are examples.

As a melamine derivative, alkoxymethyl melamine, derivatives thereof, etc. are examples.

As a uryl derivative, benzoguanamine, glycoluryl, derivatives thereof, etc. are examples.

Although the preferable content of the cross-linking agent in the protecting film varies according to the type, content, etc. of the antistatic resin, and accordingly cannot be decided categorically, it may be decided appropriately according to the purposes.

Generally, regarding the protection by the protecting film, in addition to the first function of antistatic properties, there are chemical protection and physical protection of the resist layer surface as the second function. That is, while a chemically amplified resist layer generates an acid as a catalyst at sections exposed to light, the acid thus formed is neutralized and deactivated by the basic impurities in the atmosphere particularly in the vicinity of the surface area of the resist layer, with the result that poor patterning (T-top in the case of a positive-type resist layer, and round-top in the case of a negative-type resist layer) tends to occur. Also, while the exposure to light of the resist layer is performed in vacuum owing to the characteristics of the irradiation source in the electron beam lithography or the like, substances having high sublimation properties in the components composing the resist layer are dissipated from the surface, causing degrading the patterning performance of the resist layer (such as excessive enhancement of the sensitivity to the light exposure in the vicinity of surface layer due to loss of the basic additive by dissipation and lowering of the sensitivity to light exposure by dissipation of the cross-linking agent and residual solvent), and contamination of the light exposing apparatus, when the resist layer formed on a substrate is left in vacuum. Such dissipation of the components composing the resist layer may also be caused by the heat or impact that is given at the irradiation of active-energy rays.

The protecting film according to the present invention functions as a protecting film to solve such problems, while the film itself does not affect the resist layer. In other words, the protecting film according to the present invention serves to protect the resist layer even before the irradiation of the active-energy rays. Furthermore, since most antistatic resins according to the present invention show basicity before the irradiation of the active-energy rays, it can show functions such as interception of basic materials in the atmosphere by its buffering action. Accordingly, this invention can be very useful even in the cases where prevention of electric charges is not necessary in the resist layer (for example, in a case in which the resist underlayer is composed of an electroconductive material or in a case in which no charged particle beams are used).

There is no limitation to the irradiation source for the light exposure in the present invention. From the viewpoint of the light exposure being conducted in vacuum, and the electron charges being generated in the resist layer during the light exposure, active-energy rays such as UV (ultraviolet) rays, X-rays, electron beams, excimer rays and focused ion beams, are preferable. In the case of UV rays, wavelengths not longer than 160 nm are preferable. From the viewpoint that the deviation of location of a pattern is caused by the charge-up phenomenon, and the effect of the antistatic resin is more clearly exhibited, electron charged particle beams such as electron beams and focused ion beams are particularly preferable.

A device having a pattern by fine processing that is made of a metal or other materials with a pattern width that is consistent and extremely small, can be manufactured by forming a resist pattern according to the method of the present invention, using a composition for protecting a resist according to the present invention or utilizing a multilayer body according to the present invention, followed by selective vapor deposition, etching or the like. It is possible, for example, to form a semiconductor device having wiring with a space between two adjacent wires of about 100 nm. As such applications, devices having a pattern by fine processing such as a magnetic head of a magnetic recording device are enumerated besides semiconductor devices. Furthermore, the resist pattern according to the present invention is useful as a pattern for a mask for making such resist patterns as well as other patterns.

EXAMPLES

Next, examples according to the present invention will be described in detail. It is to be noted that the "part" means part by weight, unless otherwise noted.

(1) Preparation of a Resist

The following materials were blended to form a positive-type resist (resist 1).

Base material: poly (vinylphenol/t-butyl acrylate) copolymer (the molar ratio of the vinylphenol unit and t-butyl acrylate unit being 60/40), 100 parts Photo-acid generating agent: triphenylsulfonium trifluoromethanesulfonate, 5 parts Additive: N-methylpyrrolidone, 0.5 parts Solvent: propylene glycol monomethylether acetate, 700 parts The following materials were blended to form a negative-type resist (resist 2).

Base resin: polyvinylphenol, 100 parts

Cross-linking agent: hexamethoxymethylmelamine, 10 parts

Photo-acid generating agent: triphenylsulfonium trifluoromethanesulfonate, 5 parts Additive: N-methylpyrrolidone, 0.5 parts Solvent: propylene glycol monomethyl ether acetate, 750 parts (2) Preparation of a Composition for Protecting a Resist (also Referred to as "Protective Composition" Hereinafter)

The following materials were dissolved into 1,000 parts of water/IPA (isopropanol) (the weight ratio being 95/5) to form a solution.

Protective composition 1: 3-amino-4-methoxybenzene-sulfonic acid polymer (antistatic resin), 100 parts Protective composition 2: 3-amino-4-methoxybenzene-sulfonic acid polymer, 100 parts+dodecylbenzene-sulfonic acid (acidic compound), 0.1 part, Protective composition 3: 3-amino-4-methoxybenzene-sulfonic acid polymer, 100 parts+diphenyliodonium trifluoromethanesulfonate (photo-acid generating agent), 5 parts Protective composition 4: 3-amino-4-methoxybenzene-sulfonic acid polymer, 100 parts+diphenyliodonium trifluoromethanesulfonate (photo-acid generating agent), 7.5 parts Protective composition 5: 3-amino-4-methoxybenzene-sulfonic acid polymer, 100 parts+dodecyl benzene-sulfonic acid (acidic compound), 0.2 parts Protective composition 6: 3-amino-4-methoxybenzene-sulfonic acid polymer, 100 parts+triphenylsulfonium trifluoromethanesulfonate (photo-acid generating agent), 5 parts Protective composition 7: 3-amino-4-methoxybenzene-sulfonic acid polymer, 100 parts+triphenylsulfonium trifluoromethanesulfonate (photo-acid generating agent), 7.5 parts Protective composition 8: 3-amino-4-methoxybenzene-sulfonic acid polymer, 100 parts+triphenylsulfonium trifluoromethanesulfonate (photo-acid generating agent), 5 parts+polynuclear phenol ethoxylate surfactant (nonionic surfactant), 0.0005 parts Protective composition 9: 3-amino-4-methoxybenzene-sulfonic acid polymer, 100 parts+triphenylsulfonium trifluoromethanesulfonate (photo-acid generating agent), 5 parts+tetramethoxymethyl glycoluryl, 3 parts (3) Pattern Formation Test The following model tests were performed to comprehend the effect of the present invention on the pattern formation. Resist 1 or 2 was spin-coated onto a Si substrate, and the samples were subjected to baking at 110° C. for 120 seconds. The protective compositions 1 to 7 were spin-coated onto the resist layers of the samples and then subjected to baking at 110° C. for 60 seconds to form 0.4 μm-thick protecting films. Afterwards, patterns with a 0.1 μm-wide line and space were depicted using an electron beam exposure machine with an acceleration voltage of 50 keV. After the light exposure, the samples were subjected to baking (post-exposure baking; PEB) at 110° C. for 120 seconds, and then to development with a 2.38 wt. % aqueous tetramethylammonium hydroxide solution for 60 seconds. The result of observation of the heights and the cross-sectional shapes of the thus obtained patterns under an electron microscope is shown in TABLE 1. Samples without a protecting film were also prepared.

Figure 2:
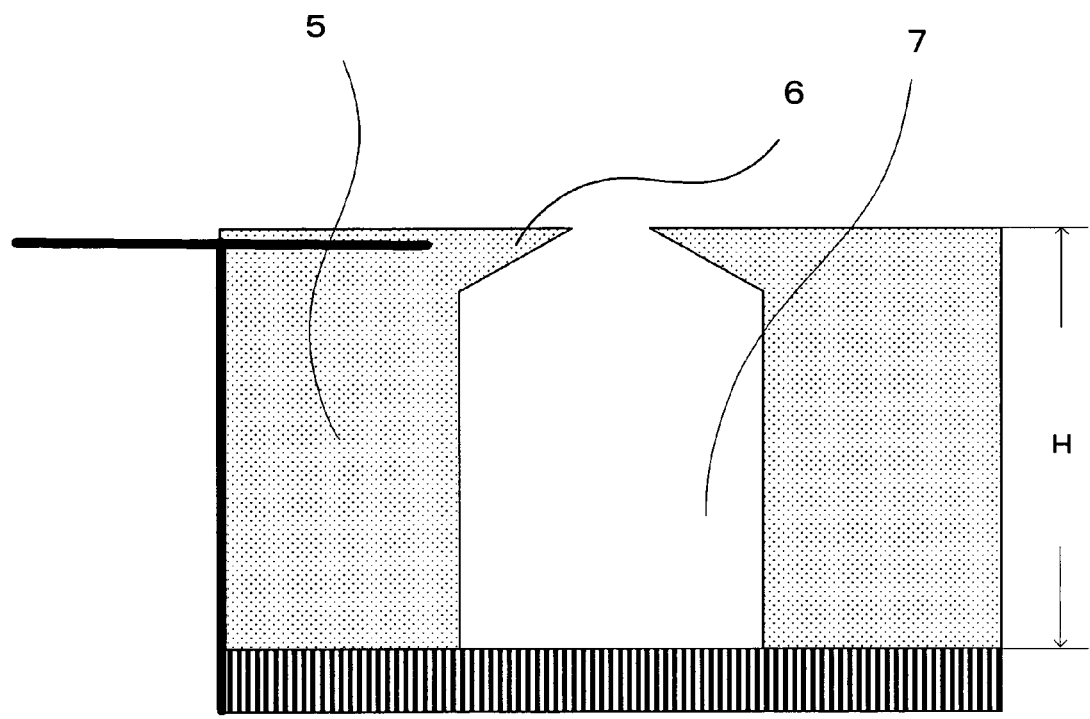
FIG. 2 is a schematic cross-sectional view of a multilayer body after development.
Figure 3:
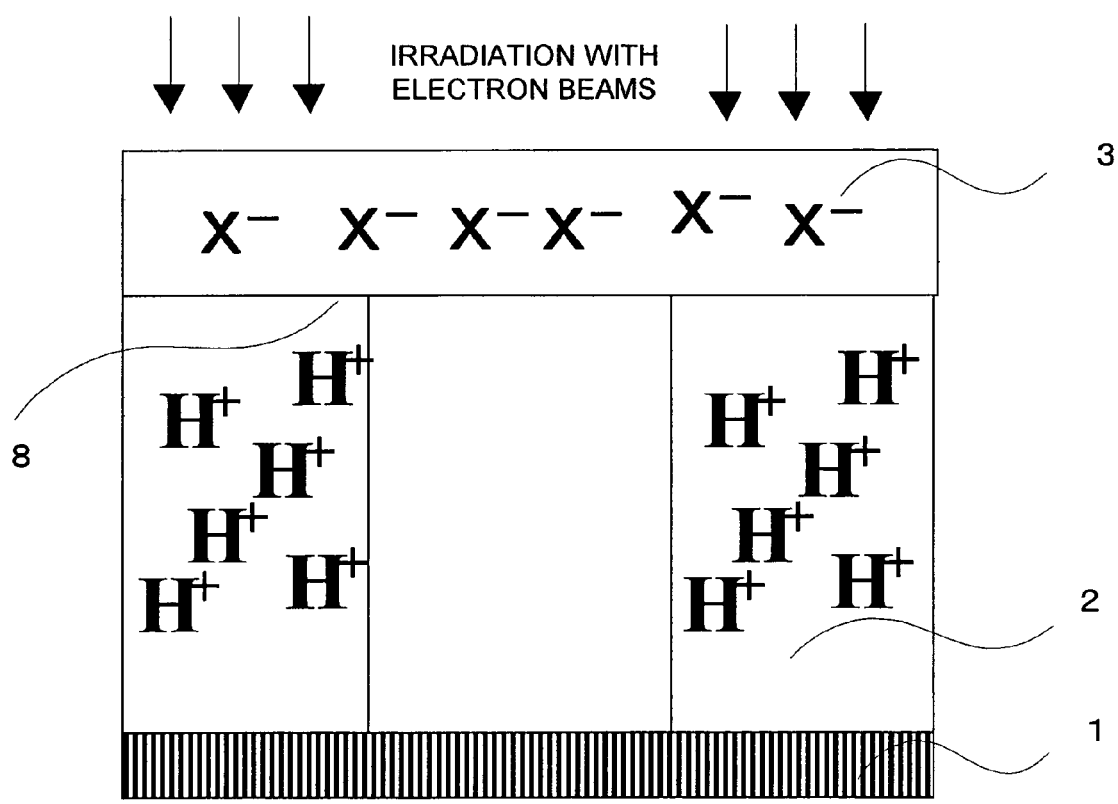
FIG. 3 is another schematic cross-sectional view of a multilayer body as it is irradiated with electron beams, where hydrogen ions of an acid are generated in a resist layer.
Figure 4:
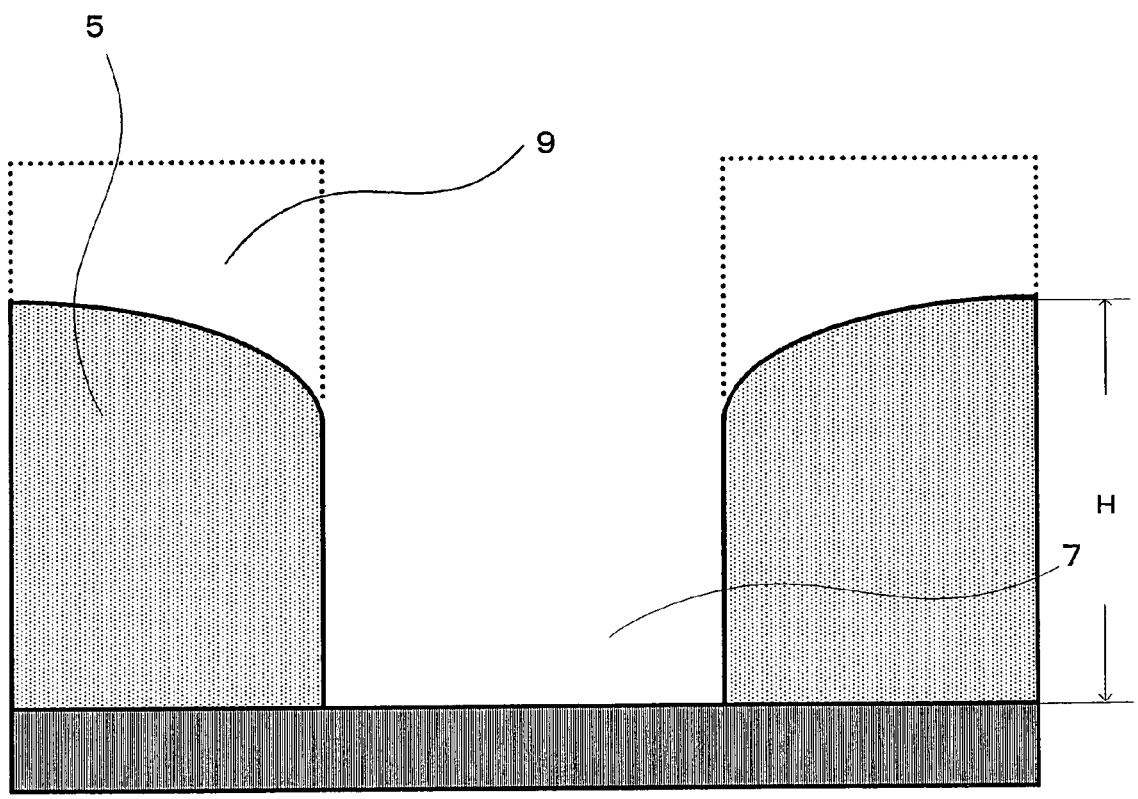
FIG. 4 is another schematic cross-sectional view of a multilayer body after development.
Figure 5:
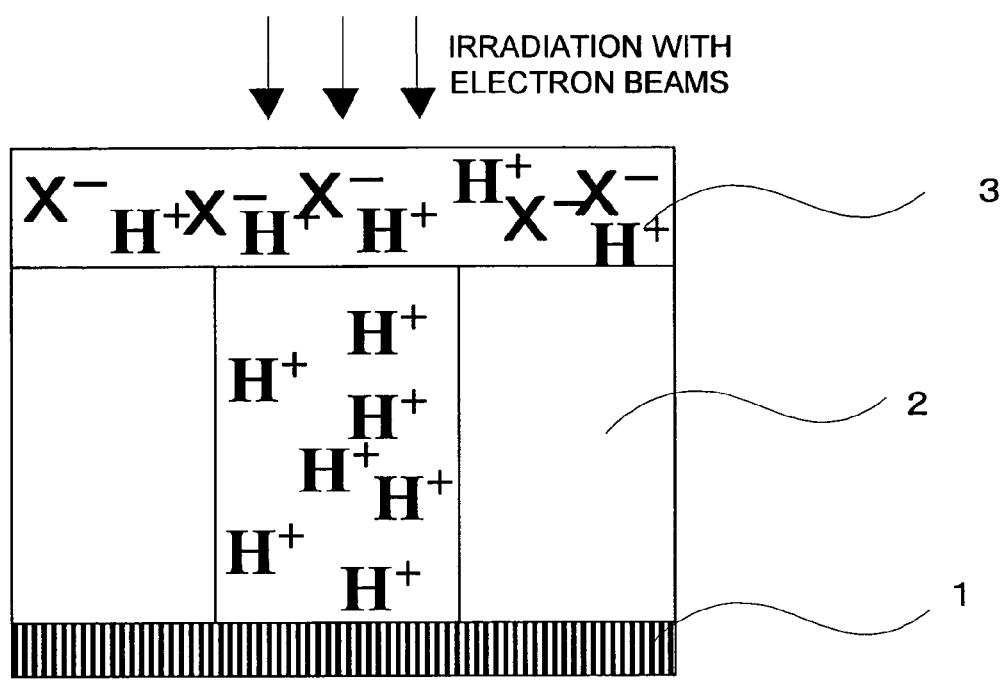
FIG. 5 is another schematic cross-sectional view of a multilayer body as it is irradiated with electron beams, where hydrogen ions of an acid are generated in a resist layer.
Figure 6:
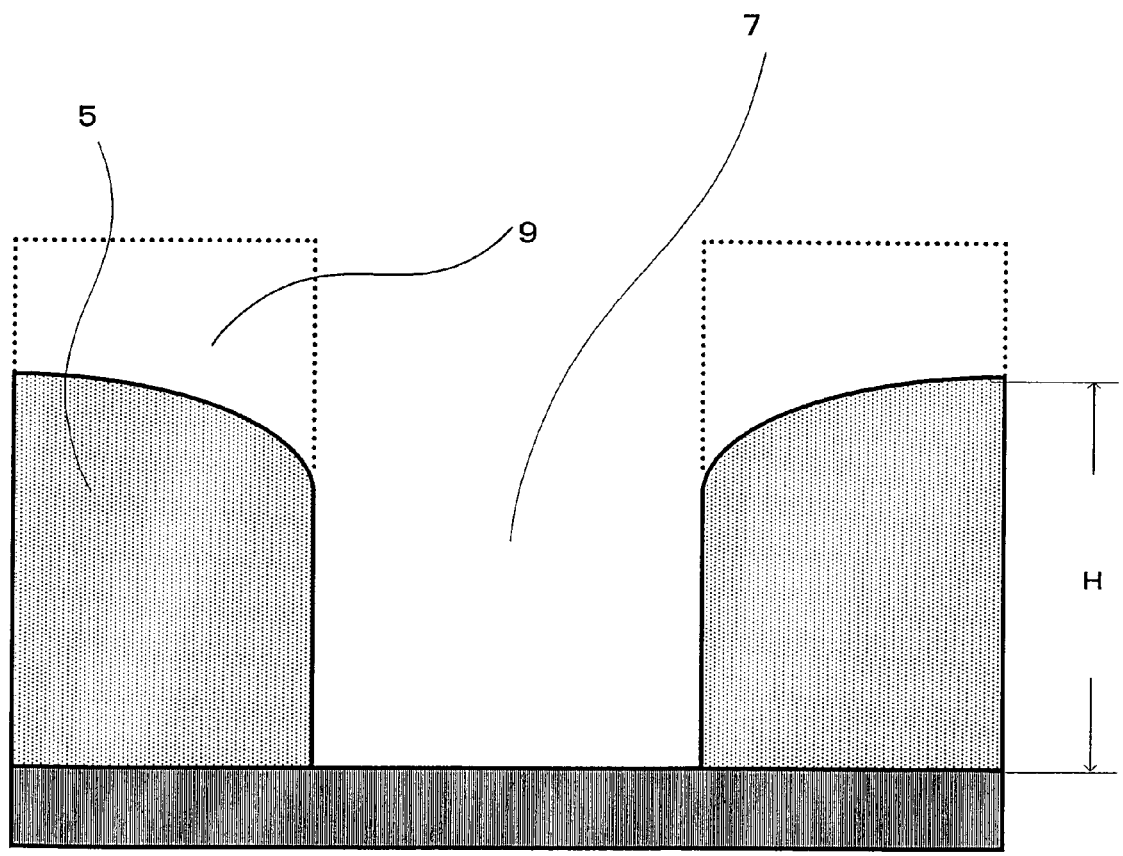
FIG. 6 is another schematic cross-sectional view of a multilayer body after development.
Figure 7:
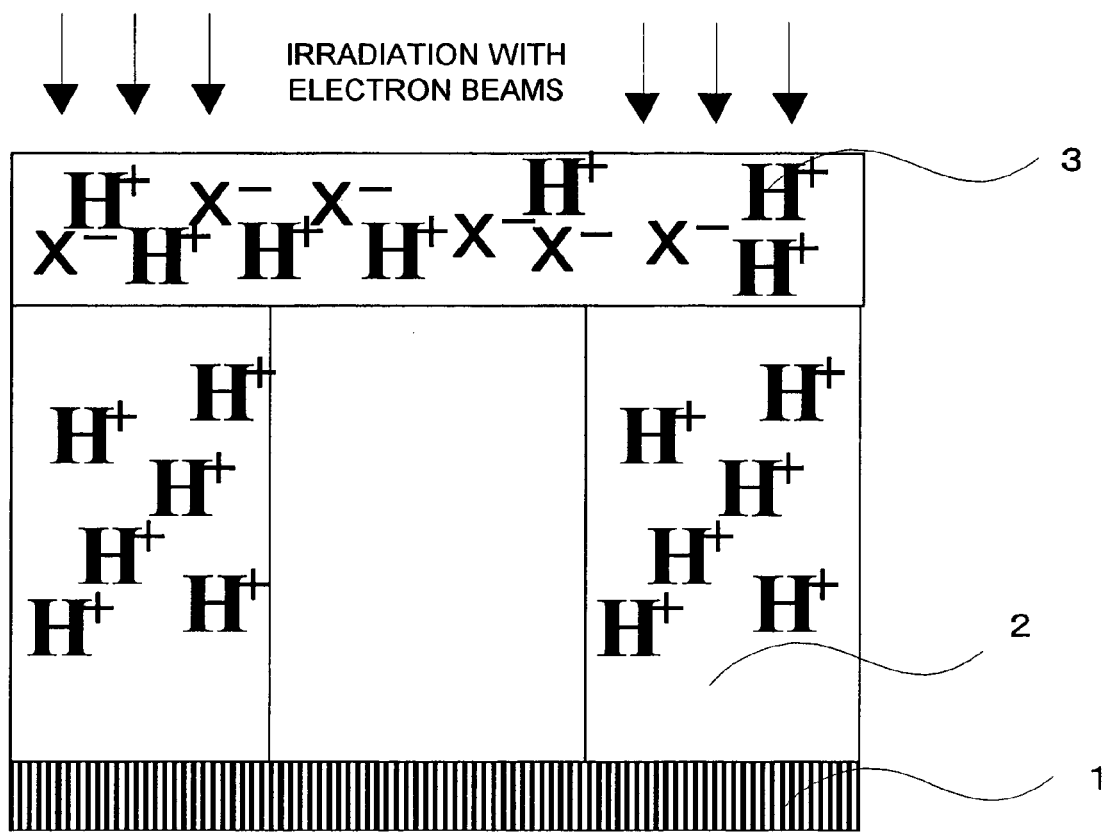
FIG. 7 is another schematic cross-sectional view of a multilayer body as it is irradiated with electron beams, where hydrogen ions of an acid are generated in a resist layer.
Figure 8:
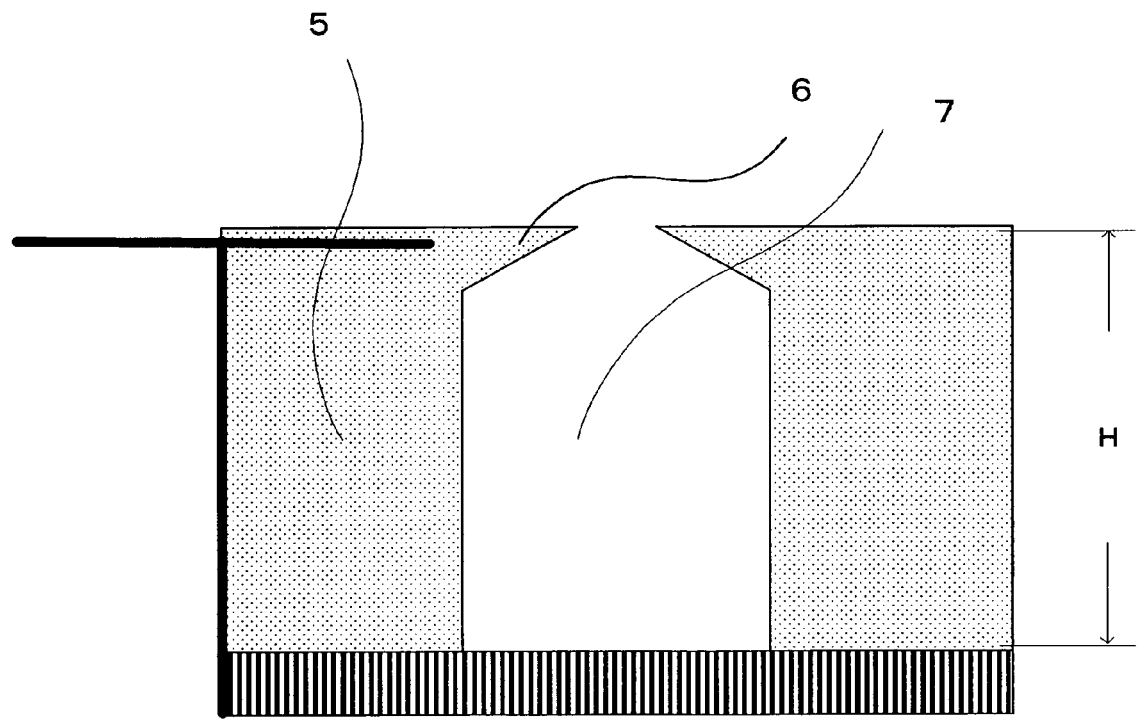
FIG. 8 is another schematic cross-sectional view of a multilayer body after development.

TABLE 1 shows the results of the above-described processes. In TABLE 1, numerals 4, 5, 7 8, 9 and 10 are for the examples, and the other are for the comparative examples. It is to be noted that the "pattern height" means "H" in FIGS. 2, 4, 6, 8, 10 and 12, the "rectangular shape" means a preferably square-built shape as shown in FIGS. 10 and 12, "T-top" means a shape as shown in FIGS. 2 and 8 wherein the cross-section of the remaining part in the resist layer—resembles a letter T, and "round top" means a rounded shape as shown in FIGS. 4 and 6, wherein the cross-section of the remaining part in the resist layer is rounded.

These results indicate that while defects in the shape occurred in the vicinity of the surface section of the resist layer in the cases of a protecting film composed only of an antistatic resin (numeral 2) and a protecting film composed of an antistatic resin and an acidic additive (numerals 3 and 6), rectangular patterns were obtained in the cases of protecting films composed of an antistatic resin and photo-acid generating agent according to the present invention. It is to be noted that the deviations of the location of patterns in the cases with an antistatic protecting film were not more than 5 nm, while those in the cases without a protecting film (numeral 1) were in the range of 10 to 100 nm from the wafer standard location due to electric charging.

From the result of TABLE 1, it is understood that the resist-protecting film according to the present invention is applicable to a plurality of resists without adjusting the acidity.

TABLE 1

| Number | Material for resist-protecting film | Height and cross-sectional shape of pattern | |
|---|---|---|---|
| | | Resist 1 | Resist 2 |
| 1 | No resist-protecting film | 215 nm/rectangular | 253 nm/rectangular |
| 2 | Protective composition 1 | 229 nm/T-top | 228 nm/round top |
| 3 | Protective composition 2 | 186 nm/round top | 271 nm/T-top |
| 4 | Protective composition 3 | 211 nm/rectangular | 257 nm/rectangular |
| 6 | Protective composition 5 | 188 nm/round top | 269 nm/T-top |
| 7 | Protective composition 6 | 227 nm/rectangular | 234 nm/rectangular |
| 8 | Protective composition 7 | 219 nm/rectangular | 248 nm/rectangular |
| 5 | Protective composition 4 | 210 nm/rectangular | 259 nm/rectangular |
| 9 | Protective composition 8 | 212 nm/rectangular | 254 nm/rectangular |
| 10 | Protective composition 9 | Not available | 256 nm/rectangular |

Example 2

Figure 13:
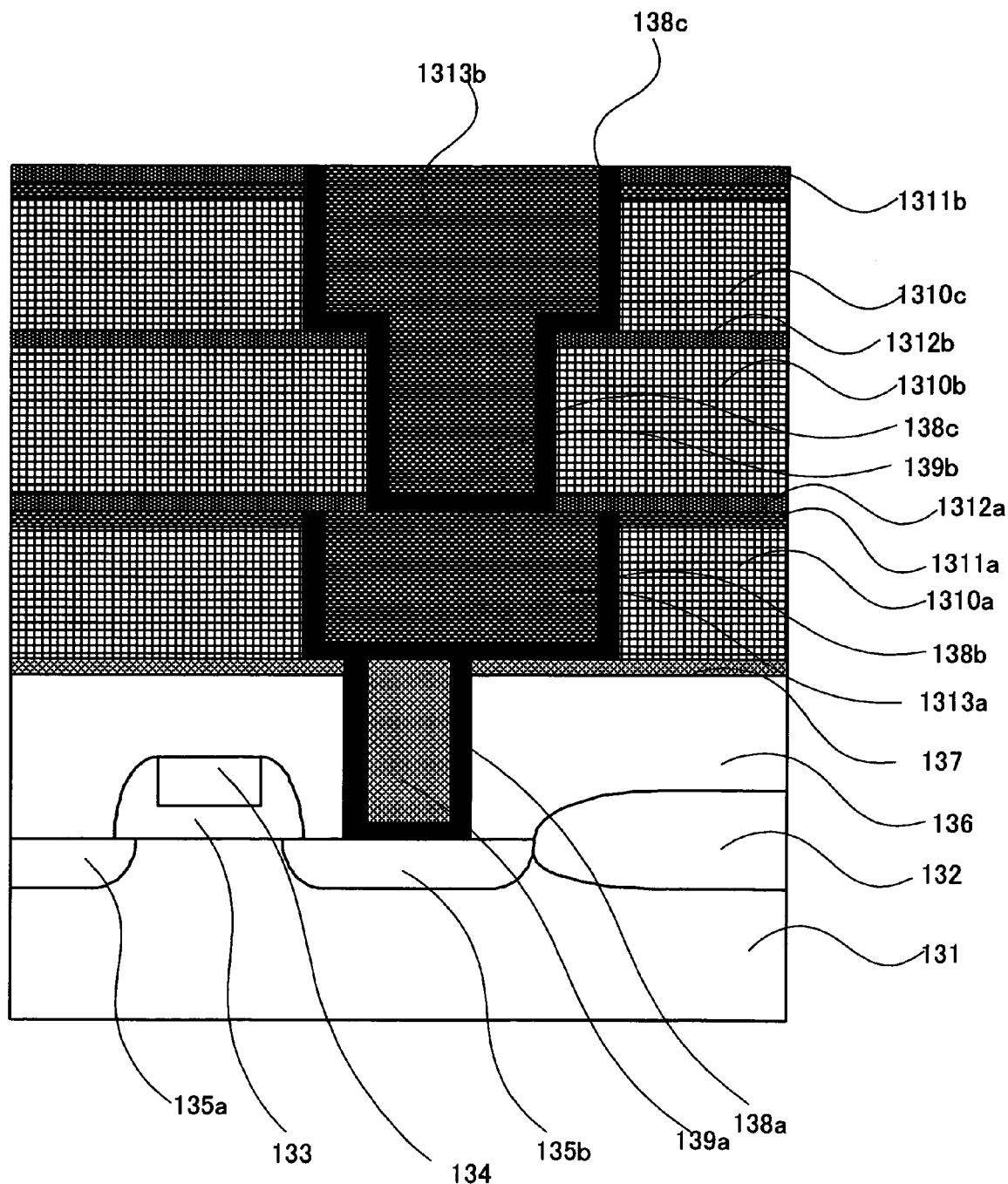
FIG. 13 is a schematic cross-sectional view of a multilayer circuit.

FIG. 13 shows an embodiment of a multilayer wiring structure. First, on a Si wafer 131 on which a layer of transistors each having a source diffusion layer 135a, a drain diffusion layer 135b, a side-wall insulating film 133, and a gate electrode 134 were formed, as separated by element separating films 132, an interlayer insulating film 136 and a stopper film 137 were formed to form contact holes for leading to electrodes.

A 25 nm thick TiN (titanium nitride) 138a was formed the contact holes by the sputtering method, which were then filled in with a blanket W 139a formed by mixing $WF_6$ and hydrogen followed by reduction, and parts except the vias were removed by chemical mechanical polishing (CMP). Next, a low dielectric constant insulating film (porous siloxane resin film) 1310a was formed to the height of 200 nm over the Si wafer, and a 25 nm thick $TEOS$-$SiO_2$ 1311a was layered as a cap film. To the film, a pattern layer with a width of 100 nm for the first wiring layer was formed, using the resist 1 of EXAMPLE 1, and processing was performed with an F plasma, using this resist layer as a mask and using a CF$_4$/CHF$_3$ gas as a raw material.

In these grooves for wiring, a 25 nm thick TiN 138b to act as a barrier to prevent copper diffusion into the insualting layer, and a 25 nm thick copper seed layer to act as an elctrode at the time of electrolytic plating were formed by sputtering. Furthermore, a 250 nm thick copper film was layered by electrolytic plating, and then metal parts except the wiring pattern parts were removed by CMP, to form the first wiring layer 1313a.

Next, the dual damascene method for forming a via layer and wiring layer at the same time will be explained. A 25 nm thick SiN film 1312a as a diffusion preventing film formed by the plasma CVD using silane and ammonia gases for the purpose of preventing copper diffusion, as well as a 300 nm thick low dielectric constant insulating film 1310b were layered on the first wiring layer 1313a. A 25 nm thick SiN film 1312b as a stopper film formed by the plasma CVD, using silane and ammonia gases and a low dielectric constant insulating film 1310c were deposited on the wiring layer parts to the height of 350 nm over the Si wafer. Then, a 25 nm thick TEOS-SiO$_2$ film 1311b was layered as a cap film. Here, a via pattern with a 100 nm diameter was formed, using the resist 1 of EXAMPLE 1. Using this as a mask, SiO$_2$/low dielectric constant insulating film/SiN/low dielectric constant insulating film/SiN layers were processed sequentially, with an F plasma, using a CF$_4$/CHF$_3$ gas as a raw material and by varying the gas composition. Next, a pattern layer with a width of 100 nm for the second wiring layer was formed, using the resist 1 of EXAMPLE 1. Processing with an F plasma was performed, using this resist layer as a mask and using a CF$_4$/CHF$_3$ gas as a raw material. To these vias and grooves for wiring, a 25 nm thick TiN 138c to act as a barrier to prevent copper diffusion into the insulating layer, and a 25 nm thick copper seed layer to act as an electrode at the time of electrolytic plating were formed by sputtering. Furthermore, a 700 nm Cu film was layered by electrolytic plating, and metal parts except the wiring pattern parts were removed by CMP, to form a wiring layer 131b and via layer 139b. After that, the above-described procedures were repeated to form the third wiring layer. Regarding the thus experimentally prepared multilayer wiring, when a resist protecting film was not used during the patterning of resist 1, the production yield was not more than 1% in the continuous production of 1 million vias, due to misalignment of the locations of vias. Furthermore, although the production yield was not more than 60% due to defective shape of the resist, when the protective composition 1 in EXAMPLE 1 was used, it was not less than 95%, when the protective composition 3, 4 and 7 according to the present invention were used, respectively.

What is claimed is:

1. A multilayer body having a patternable resist layer comprising a photo-acid generating agent and a resist-protecting film on a substrate, wherein the resist protecting film comprises an antistatic resin and a photo-acid generating agent,
    wherein said photo-acid generating agent in said resist-protecting film is the same as the photo-acid generating agent in said resist layer, and the content of said photo-acid generating agent in said resist-protecting film is the same as or higher than that of the photo-acid generating agent in said resist layer,
    wherein said antistatic resin comprises a water-soluble polymer,
    wherein said photo-acid generating agent comprises at least one compound selected from the group consisting of diphenyliodonium trifluoromethanesulfonate, diphenyliodonium perfluorobutanesulfonate, diphenyliodonium hexafluorophosphate, triphenylsulfonium hexafluoroantimonate, triphenylsulfonium hexafluorophosphate, triphenylsulfonium methanesulfonate, triphenylsulfonium trifluoromethanesulfonate, triphenylsulfonium perfluorobutanesulfonate, 1-phenyl-1-(4-methylphenyl)sulfonyloxy-1-benzoylmethane, 1,2,3-trisulfonyloxymethylbenzene, 1,3-dinitro-2-(4-phenylsulfonyloxymethyl)benzene and 1-phenyl-1-(4-methylphenylsulfonyloxymethyl)-1-hydroxy-1-benzoylmethane, and
    wherein said antistatic resin comprises at least one of basic materials selected from the group consisting of 3-amino-4-methoxybenzenesulfonic acid polymers and polymers having a monomer unit selected from
    pyrrole-3-(2-ethanesulfonic acid), pyrrole-3-(3-propanesulfonic acid), pyrrole-3-(4-butanesulfonic acid), pyrrole-3-(5-pentanesulfonic acid), pyrrole-3-(6-hexanesulfonic acid), aniline-3-(2-ethanesulfonic acid), aniline-3-(3-propanesulfonic acid), aniline-3-(4-butanesulfonic acid), aniline-3-(5-pentanesulfonic acid), aniline-3-(6-hexanesulfonic acid), aniline-3-(7-heptanesulfonic acid), aniline-3-(2-methyl-3-propanesulfonic acid), aniline-3-(2-methyl-4-butanesulfonic acid), aniline-3-sulfonic acid, aniline-N-(2-ethanesulfonic acid), aniline-N-(3-propanesulfonic acid), aniline-N-(4-butanesulfonic acid), aniline-N-(5-pentanesulfonic acid), aniline-N-(6-hexanesulfonic acid), aniline-N-(7-heptanesulfonic acid), aniline-N-(2-methyl-3-propanesulfonic acid), aniline-N-(2-methyl-4-butanesulfonic acid), 2-aminoanisole-3-sulfonic acid, 2-aminoanisole-4-sulfonic acid, 2-aminoanisole-5-sulfonic acid, 2-aminoanisole-6-sulfonic acid, 3-aminoanisole-2-sulfonic acid, 3-aminoanisole-4-sulfonic acid, 3-aminoanisole-5-sulfonic acid, 3-aminoanisole-6-sulfonic acid, 4-aminoanisole-2-sulfonic acid, 4-aminoanisole-3-sulfonic acid, 2-amino-4-ethoxybenzenesulfonic acid, 3-amino-4-ethoxybenzenesulfonic acid, 2-amino-4-butoxybenzenesulfonic acid, 3-amino-5-butoxybenzenesulfonic acid, 2-amino-4-propoxybenzenesulfonic acid, 3-amino-6-propoxybenzenesulfonic acid, 2-amino-4-isobutoxybenzenesulfonic acid, 3-amino-4-isobutoxybenzenesulfonic acid, 3-amino-4-t-butoxybenzenesulfonic acid, 2-amino-4-t-butoxybenzenesulfonic acid, 2-amino-4-heptoxybenzenesulfonic acid, 3-amino-5-heptoxybenzenesulfonic acid, 2-amino-4-hexoxybenzenesulfonic acid, 3-amino-5-octoxybenzenesulfonic acid, 2-amino-4-nanoxybenzenesulfonic acid, 3-amino-5-decanoxybenzenesulfonic acid, 2-amino-4-undecanoxybenzenesulfonic acid, and 3-amino-5-dodecanoxybenzenesulfonic acid.

2. A multilayer body according to claim 1 for manufacturing a semiconductor device, a mask or a magnetic head.

3. A multilayer body according to claim 1, wherein a resist for said patternable resist layer is a chemically amplified positive-type resist or a chemically amplified negative-type resist.

4. A multilayer body according to claim 1, wherein said photo-acid generating agent is water-soluble.

5. A multilayer body according to claim 1, wherein said patternable resist layer comprises a photo-acid generating agent, and the sensitivity of said photo-acid generating agent is the same as or higher than that of the photo-acid generating agent in said resist layer.

6. A multilayer body according to claim 1 having a patternable resist layer comprising a photo acid generating agent, and a resist-protecting film comprising an antistatic resin, a photo-acid generating agent and a surfactant, on a substrate.

7. A multilayer body according to claim 1 having a patternable resist layer comprising a photo acid generating agent, and a resist-protecting film comprising an antistatic resin, a photo-acid generating agent and a cross-linking agent, on a substrate.

8. A multilayer body according to claim 1, wherein the thickness of said resist-protecting film is in the range of 0.01-0.2 µm.

* * * * *